(12) United States Patent
Cho et al.

(10) Patent No.: US 12,054,071 B2
(45) Date of Patent: Aug. 6, 2024

(54) CONTROL OF VEHICLE BATTERY

(71) Applicant: FORD GLOBAL TECHNOLOGIES, LLC, Dearborn, MI (US)

(72) Inventors: Gyouho Cho, North York (CA); Kevin Vander Laan, Bloomfield Hills, MI (US); Richard D. Lagerstrom, Huntington Woods, MI (US); Allen Joseph Gilbert, Grosse Ile, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 271 days.

(21) Appl. No.: 17/573,116

(22) Filed: Jan. 11, 2022

(65) Prior Publication Data
US 2023/0219456 A1 Jul. 13, 2023

(51) Int. Cl.
| | |
|---|---|
| *B60L 58/10* | (2019.01) |
| *B60L 50/60* | (2019.01) |
| *G01R 31/36* | (2020.01) |
| *G01R 31/3828* | (2019.01) |
| *G01R 31/392* | (2019.01) |
| *H01M 10/48* | (2006.01) |

(52) U.S. Cl.
CPC ............ *B60L 58/10* (2019.02); *B60L 50/60* (2019.02); *G01R 31/3648* (2013.01); *G01R 31/3828* (2019.01); *G01R 31/392* (2019.01); *H01M 10/48* (2013.01)

(58) Field of Classification Search
CPC ..... B60L 58/10; B60L 50/60; G01R 31/3648; G01R 31/3828; G01R 31/392; H01M 10/48
USPC .......................................................... 701/22
See application file for complete search history.

(56) References Cited

U.S. PATENT DOCUMENTS

| | | | | |
|---|---|---|---|---|
| 5,869,950 A | * | 2/1999 | Hoffman, Jr. | ......... B60W 10/26 |
| | | | | 320/132 |
| 7,570,022 B2 | * | 8/2009 | Zettel | ..................... H02J 7/0069 |
| | | | | 320/132 |

(Continued)

FOREIGN PATENT DOCUMENTS

| | | | | |
|---|---|---|---|---|
| CA | 3215497 A1 | * | 10/2022 | ............ B60L 3/0046 |
| CA | 2925319 C | * | 7/2023 | .............. B60L 50/00 |

(Continued)

OTHER PUBLICATIONS

Patil, et al.; Optimal battery utilization over lifetime for parallel hybrid electric vehicle to maximize fuel economy; Jul. 8, 2016; 2016 American Control Conference (IEEE Explore; https://ieeexplore.ieee.org/document/7525132) (Year: 2016).*

(Continued)

*Primary Examiner* — Atul Trivedi
(74) *Attorney, Agent, or Firm* — David B Kelley; Brooks Kushman P.C.

(57) ABSTRACT

A vehicle includes a controller that, during a predefined period of time and responsive to an average current of the battery exceeding a first current threshold for a first period of time, reduces a maximum current threshold of the battery by a first amount, and during the predefined period of time and responsive to the average current exceeding a second current threshold for a second period of time, further reduces the maximum current threshold by a second amount.

17 Claims, 3 Drawing Sheets

(56) References Cited

U.S. PATENT DOCUMENTS

| | | | | |
|---|---|---|---|---|
| 8,159,189 | B2 * | 4/2012 | Zhang | G01R 31/392 |
| | | | | 320/136 |
| 8,552,682 | B2 * | 10/2013 | Potter | B60W 10/26 |
| | | | | 320/109 |
| 8,775,008 | B2 * | 7/2014 | Rini | B60L 58/16 |
| | | | | 396/48 |
| 9,590,431 | B2 | 3/2017 | Ohkawa et al. | |
| 9,846,198 | B2 * | 12/2017 | Butzmann | H01M 10/482 |
| 9,931,959 | B2 | 4/2018 | Aoshima et al. | |
| 9,956,887 | B2 | 5/2018 | Duan et al. | |
| 11,072,258 | B2 * | 7/2021 | Kumar | B60L 50/60 |
| 2007/0239374 | A1 * | 10/2007 | Dougherty | G01R 31/392 |
| | | | | 702/63 |
| 2015/0066416 | A1 * | 3/2015 | Loftus | G01R 31/69 |
| | | | | 702/120 |
| 2015/0066837 | A1 * | 3/2015 | Twarog | B60L 58/12 |
| | | | | 706/58 |
| 2016/0084911 | A1 * | 3/2016 | Mensah-Brown | G01R 31/392 |
| | | | | 324/426 |
| 2016/0103185 | A1 * | 4/2016 | Chang | G01R 31/3835 |
| | | | | 324/429 |
| 2016/0276843 | A1 * | 9/2016 | Chang | H02J 7/00714 |
| 2016/0377686 | A1 * | 12/2016 | Uchida | G01R 31/3842 |
| | | | | 702/63 |
| 2017/0242079 | A1 * | 8/2017 | Duan | B60L 58/15 |
| 2017/0253140 | A1 * | 9/2017 | Chang | H02J 7/16 |
| 2017/0297435 | A1 * | 10/2017 | Wand | B60L 3/0038 |
| 2018/0166720 | A1 * | 6/2018 | Asano | H02J 7/00 |
| 2018/0170207 | A1 * | 6/2018 | Ko | B60L 58/26 |
| 2018/0172770 | A1 * | 6/2018 | Sun | B60L 58/10 |
| 2018/0202398 | A1 * | 7/2018 | Jammoussi | F02M 35/104 |
| 2018/0204393 | A1 * | 7/2018 | Landolsi | G07C 5/006 |
| 2019/0009686 | A1 * | 1/2019 | Wang | B60L 58/10 |
| 2019/0126770 | A1 * | 5/2019 | Koch | B60L 58/12 |
| 2019/0176639 | A1 * | 6/2019 | Kumar | B60L 3/0046 |
| 2019/0181657 | A1 * | 6/2019 | Deshpande | F02N 11/0862 |
| 2020/0033419 | A1 * | 1/2020 | Gass | B60L 58/16 |
| 2020/0122584 | A1 * | 4/2020 | Zhang | B60W 10/30 |
| 2020/0164763 | A1 * | 5/2020 | Holme | B60L 58/16 |
| 2020/0357197 | A1 * | 11/2020 | Chen | H01M 10/48 |
| 2020/0381923 | A1 * | 12/2020 | Chow | H01M 10/4207 |
| 2021/0270907 | A1 * | 9/2021 | Shimonishi | H01M 10/4285 |
| 2021/0323442 | A1 * | 10/2021 | Wu | B60L 3/0046 |
| 2021/0328270 | A1 * | 10/2021 | Min | H02J 7/0013 |
| 2021/0380013 | A1 * | 12/2021 | Moszynski | B60L 53/66 |
| 2022/0140300 | A1 * | 5/2022 | Yang | H02J 7/00302 |
| | | | | 320/118 |
| 2022/0223937 | A1 * | 7/2022 | Xu | B60L 50/60 |
| 2022/0229118 | A1 * | 7/2022 | Budny | G01R 31/371 |
| 2022/0294029 | A1 * | 9/2022 | Yoshida | B60L 53/00 |
| 2023/0137917 | A1 * | 5/2023 | Suzuki | H01M 10/441 |
| | | | | 702/63 |
| 2023/0219456 | A1 * | 7/2023 | Cho | B60L 58/10 |
| | | | | 701/22 |
| 2023/0234550 | A1 * | 7/2023 | Eifert | G01R 31/367 |
| | | | | 701/36 |

FOREIGN PATENT DOCUMENTS

| | | | | |
|---|---|---|---|---|
| CN | 103970983 | A * | 8/2014 | |
| CN | 105264395 | A * | 1/2016 | G07C 5/0841 |
| CN | 114940100 | A * | 8/2022 | B60L 1/006 |
| CN | 115764008 | A * | 3/2023 | B60L 3/0046 |
| CN | 116660773 | A * | 8/2023 | |
| CN | 117124931 | A * | 11/2023 | |
| EP | 2752962 | A1 * | 7/2014 | B60L 11/007 |
| EP | 4060785 | A1 * | 9/2022 | B60L 3/0007 |
| EP | 4089790 | A1 * | 11/2022 | G01K 7/22 |
| FR | 2975188 | A1 * | 11/2012 | G01R 31/3679 |
| GB | 2498817 | A * | 7/2013 | |
| KR | 20230034174 | A * | 3/2023 | H01M 10/48 |
| WO | 2021044132 | A1 | 3/2021 | |
| WO | WO-2022229611 | A1 * | 11/2022 | G01R 31/392 |
| WO | WO-2023052822 | A1 * | 4/2023 | |
| WO | WO-2023176102 | A1 * | 9/2023 | |
| WO | WO-2023188772 | A1 * | 10/2023 | |
| WO | WO-2023224414 | A1 * | 11/2023 | |

OTHER PUBLICATIONS

Yiu, et al.; Remote vehicle state of health monitoring and its application to vehicle no-start prediction; Sep. 1, 2014; 2009 IEEE AUTOTESTCON, pp. 89-93 https://ieeexplore.ieee.org/document/5314011 (Year: 2014).*

Panday, et al.; Fuel efficiency optimization of input-split hybrid electric vehicle using DIRECT algorithm; Dec. 1, 2014; 2014 9th International Conference on Industrial and Information System (ICIIS), p. 1-6 https://ieeexplore.ieee.org/document/7036640 (Year: 2014).*

* cited by examiner

CONTROL OF VEHICLE BATTERY

TECHNICAL FIELD

The present disclosure relates to methods for controlling battery operation on an electrically powered vehicle.

BACKGROUND

Electrically powered vehicles including battery electric vehicles (BEVs) and hybrid electric vehicles have become increasingly popular. However, vehicle users may experience different degrees of battery performance based on operating condition such as operating time and current drawn from the traction battery. Changes in battery performance may be temporary or permanent.

SUMMARY

A vehicle includes a battery, a sensor configured to measure an output current of the battery, and a controller. The controller, during a predefined period of time and responsive to an average current of the battery exceeding a first current threshold for a first period of time, reduces a maximum current threshold of the battery by a first amount, and, during the predefined period of time and responsive to the average current exceeding a second current threshold for a second period of time, further reduces the maximum current threshold by a second amount. The second current threshold is less than the first current threshold, and the second period of time is longer than the first period of time.

A method includes reducing a maximum current threshold of a traction battery by a first amount after an average current of the traction battery exceeds a first current threshold for a first time period during a battery cycle, and reducing the maximum current threshold by a second amount after the average current exceeds a second current threshold less than the first current threshold for a second time period longer than the first time period during the battery cycle.

A power system for a vehicle includes a controller that, after an average current of a traction battery exceeds a first threshold value for a first duration of a predefined period of time, reduces a maximum current threshold of the battery by a predefined amount for an entirety of a rest of the predefined period of time, and upon expiration of the predefined period of time, increases the maximum current threshold.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The present disclosure, among other things, proposes a system and method for controlling a battery on an electrically powered vehicle.

Figure 1:
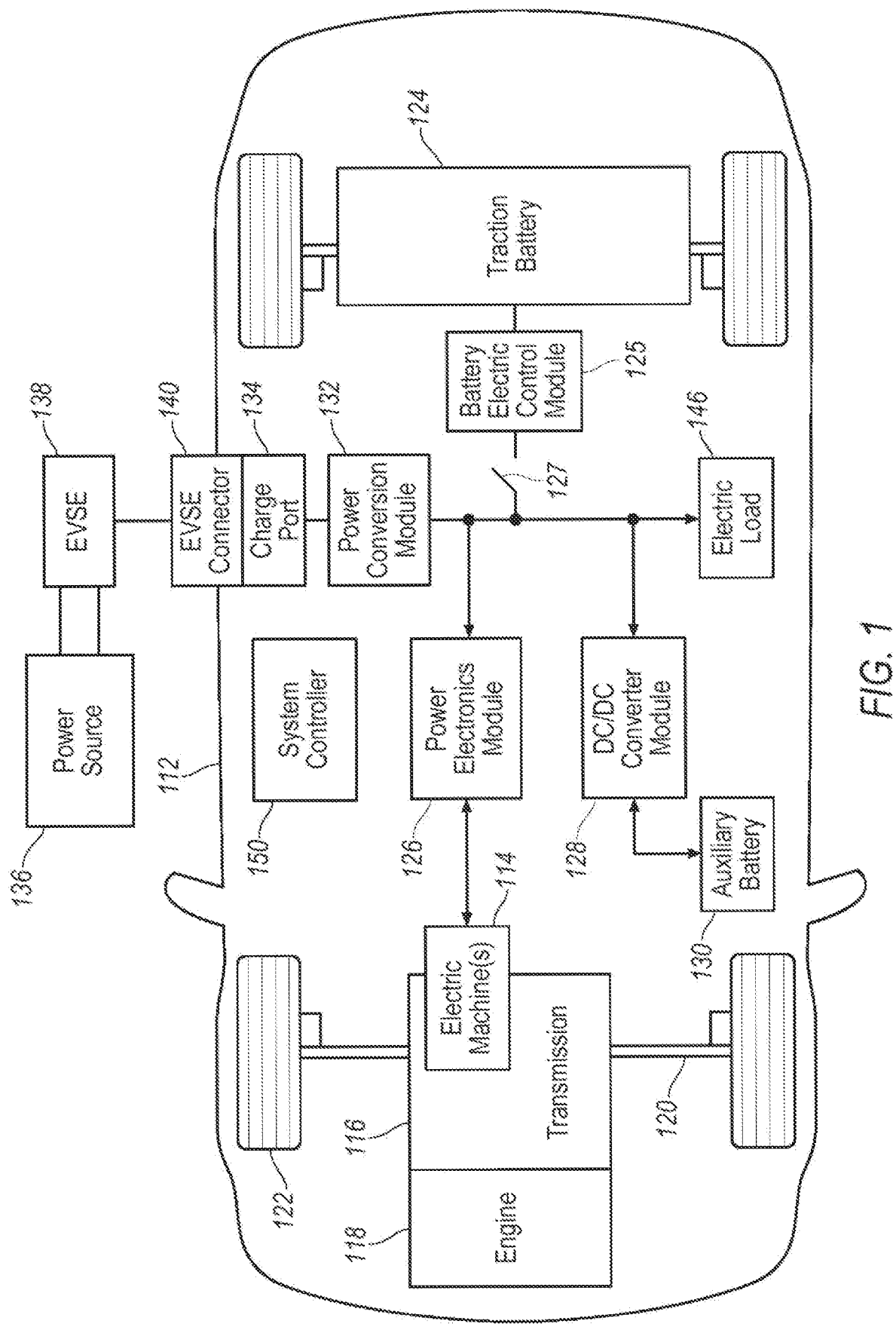
FIG. 1 illustrates an example block topology of an electrified vehicle illustrating drivetrain and energy storage components.

FIG. 1 illustrates a plug-in hybrid-electric vehicle (PHEV). A plug-in hybrid-electric vehicle 112 may comprise one or more electric machines (electric motors) 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 may provide propulsion and deceleration capability when the engine 118 is turned on or off. The electric machines 114 may also act as generators and may provide fuel economy benefits by recovering energy that would be lost as heat in the friction braking system. The electric machines 114 may also reduce vehicle emissions by allowing the engine 118 to operate at more efficient speeds and allowing the hybrid-electric vehicle 112 to be operated in electric mode with the engine 118 off under certain conditions.

A traction battery or battery pack 124 stores energy that may be used by the electric machines 114. A vehicle battery pack 124 may provide a high voltage DC output. The traction battery 124 may be electrically coupled to one or more battery electric control modules (BECM) 125. The BECM 125 may be provided with one or more processors and software applications configured to monitor and control various operations of the traction battery 124. The traction battery 124 may be further electrically coupled to one or more power electronics modules 126. The power electronics module 126 may also be referred to as a power inverter. One or more contactors 127 may isolate the traction battery 124 and the BECM 125 from other components when opened and couple the traction battery 124 and the BECM 125 to other components when closed. The power electronics module 126 may also be electrically coupled to the electric machines 114 and provide the ability to bi-directionally transfer energy between the traction battery 124 and the electric machines 114. For example, a traction battery 124 may provide a DC voltage while the electric machines 114 may operate using a three-phase AC current. The power electronics module 126 may convert the DC voltage to a three-phase AC current for use by the electric machines 114. In a regenerative mode, the power electronics module 126 may convert the three-phase AC current from the electric machines 114 acting as generators to the DC voltage compatible with the traction battery 124. The description herein is equally applicable to a pure electric vehicle. For a pure electric vehicle, the hybrid transmission 116 may be a gear box connected to the electric machine 114 and the engine 118 may not be present.

In addition to providing energy for propulsion, the traction battery 124 may provide energy for other vehicle electrical systems. A vehicle may include a DC/DC converter module 128 that converts the high voltage DC output of the traction battery 124 to a low voltage DC supply that is compatible with other low-voltage vehicle loads. An output of the DC/DC converter module 128 may be electrically coupled to an auxiliary battery 130 (e.g., 12V battery).

The vehicle 112 may be a battery electric vehicle (BEV) or a plug-in hybrid electric vehicle (PHEV) in which the traction battery 124 may be recharged by an external power source 136. The external power source 136 may be a connection to an electrical outlet. The external power source 136 may be an electrical power distribution network or grid as provided by an electric utility company. The external power source 136 may be electrically coupled to electric vehicle supply equipment (EVSE) 138. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled may transfer power using a wireless inductive coupling.

One or more electrical loads 146 may be coupled to the high-voltage bus. The electrical loads 146 may have an associated controller that operates and controls the electrical loads 146 when appropriate. Examples of electrical loads 146 may be a heating module, an air-conditioning module, or the like.

The various components discussed may have one or more associated controllers to control and monitor the operation of the components. The controllers may communicate via a serial bus (e.g., Controller Area Network (CAN)) or via discrete conductors. A system controller 150 may be present to coordinate the operation of the various components. It is noted that the system controller 150 is used as a general term and may include one or more controller devices configured to perform various operations in the present disclosure. For instance, the system controller 150 may be programmed to enable a powertrain control function to operate the powertrain of the vehicle 112. The system controller 150 may be further programmed to enable a telecommunication function with various entities (e.g. a server) via a wireless network (e.g. a cellular network).

The system controller 150 and/or BECM 125, individually or combined, may be programmed to perform various operations with regard to the traction battery 124. The traction battery 124 may be a rechargeable battery made of one or more rechargeable cells (e.g. lithium-ion cells). Due to the nature of the battery cells, the traction battery 124 may suffer from a degradation after extensive operation. The degradation may start as a temporary characteristic and may be recoverable if no extensive operation is applied to the battery for a following period of time. However, if the battery continues to operate in the extensive operating cycle, the temporary degradation may become permanent and not recoverable. In one aspect of the present disclosure, a method to operate the traction battery 124 is proposed to prevent or minimize the temporary and/or permanent battery degradation. The present disclosure proposes a method for limiting the battery power with respect to operating time to limit the battery degradation. Referring to Table 1, an example average amount of current corresponding to a usage time within a battery cycle within which no temporary battery degradation is illustrated.

TABLE 1

Power allowance category that does not cause battery degradation.

| Allowance Category | Voltage (V) | Current (A) | Power (kW) | Time (Hr) | Charge (A h) | Energy (kW h) |
|---|---|---|---|---|---|---|
| 1 | 400 | 70 | 28 | 2 | 140 | 56 |
| 2 | 400 | 60 | 24 | 4 | 240 | 96 |
| 3 | 400 | 50 | 20 | 6 | 300 | 120 |
| 4 | 400 | 35 | 14 | 10 | 350 | 140 |
| 5 | 400 | 25 | 10 | 15 | 370 | 150 |

In the example illustrated in Table 1, each power allowance category defines a current corresponding to usage time within a battery cycle which may be a predefined extended period of time. The battery cycle in the present example may be 24 hours (i.e. one day). Taking category No. 1, the 70 A average current for instance, if the traction battery experiences less than 70 A average current for a 2 hours usage time, no temporary degradation will be incurred. On the other hand, if the 70 A average current within the 2 hours usage time is reached, and the battery continues to operate in such an intensive condition, temporary and/or permanent battery degradation may be incurred. To prevent the battery from degrading, the vehicle 112 may automatically switch to the next category. In the example illustrated in Table 1, responsive to the battery meeting the power allowance specified in category No. 1, the vehicle 112 may switch to category No. 2 to extend the usage time to 4 hours and limit the average battery current to be 60 A inclusive of the previous category (i.e. 70 A—2 hours). Since the second category is associated with a longer usage time (i.e. 4 hours), the total energy allowance of the second category 96 kWh is more than the 56 kWh associated with the first category. Similarly, each subsequent category is associated with a higher energy amount compared with the previous category. The increased energy amount enables the sequential switch to the subsequent category by the vehicle. It is noted that the present disclosure is not limited to battery current but also extends to utilizing an average battery power under essentially the same concept. Since the battery voltage is fixed or determinable, the battery power may be determined from the current. As illustrated in Table 1, the voltage for the traction battery 124 is 400V. Therefore, the average power allowance for each allowance category may be determined. Further, the battery current (as well as battery power) may include both the discharge current and the charge current in the present example.

Figure 2:
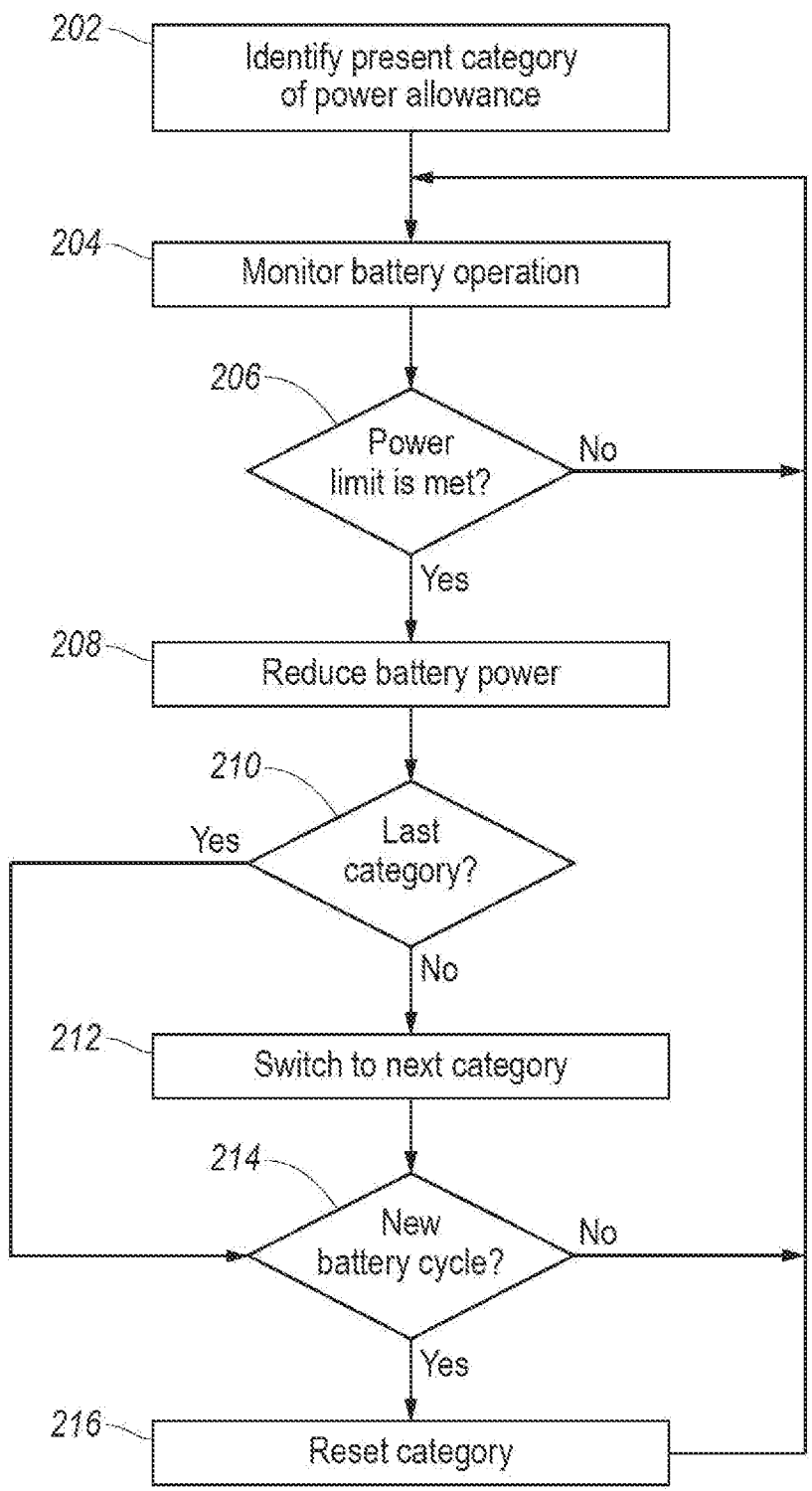
FIG. 2 illustrates a flow diagram for a battery control process.

Referring to FIG. 2, an example flow diagram for a battery control process 200 is illustrated. With continuing reference to FIG. 1, the process 200 may be implemented via the system controller 150, and/or the BECM 125 individually or in combination thereof. For simplicity purposes, the following description will be made with reference to the system controller 150. At operation 202, the system controller 150 identifies an allowance category to start with. With continuing reference to Table 1, the system controller 150 may be configured to choose the first category by default for each new battery cycle. Alternatively, the system controller 150 may be configured to skip one or more categories depending various conditions such as operating temperature, current battery health, vehicle fuel level, anticipated power demand or the like. For instance, responsive to detecting the battery health is still above a predefined threshold (e.g. 80%), the system controller 150 may skip the first category and start with the second category by default such that lesser power restrictions may be imposed to the battery 124 due to the currently good battery health. In case of a hybrid vehicle (i.e. the vehicle 112 also has a conventional engine 118), the system controller may further select the appropriate starting category by the conventional fuel level of the vehicle 112. For instance, responsive to the vehicle having sufficient conventional fuel (e.g. more than half tank of gasoline), the system controller 150 may select the first category by default such that more limitations on the battery power may be imposed. The increased limitations on the battery power may be compensated by the power output from engine 118 which requires a sufficient conventional fuel level. If the system controller 150 detects the conventional fuel level is less than one or more predefined thresholds, the system controller 150 may skip one or more categories for the starting category. In a more extreme example, if the vehicle conventional fuel level is below a low threshold (e.g. 10%), the system controller 150 may skip all categories of battery power allowance and not impose any limitations on the battery power such that the vehicle 112 may have sufficient propulsion power from the traction battery 124.

At operation 204, the system controller 150 monitors the operations of the traction battery 124 via one or more sensors (e.g. current sensors). At operation 206, the system controller 150 verifies if the power allowance associated with the present category has been met. If the answer is no, the process returns to operation 204 to continue monitoring the battery operations. Otherwise, if the power allowance has been met, the process proceeds to operation 208 and the system controller 150 imposes a power limitation on the battery 124 to reduce the power performance. The amount of power limitation may vary depending on the present category. In one example, more limitation may be imposed for a prior category than for a subsequent category. Continuing with the example in Table 1, a 50% power reduction may be imposed switching from category No. 1 to category No. 2, and subsequently, a 20% power reduction may be imposed switching from category No. 2 to category No. 3. As an alternative example, the power limitation may be evenly imposed on each category (e.g. 10%). At operation 210, the system controller 150 verifies if the present category is the last category of the battery control scheme. If the answer is no indicating one or more subsequent allowance categories exist, the process proceeds to operation 212 and the system controller 150 switches to the subsequent category from the present category. At operation 214, the system controller 150 verifies if a new battery cycle has started. If the answer is no and the battery 124 is still operating in the present battery cycle, the process returns to operation 204 and the system controller 150 continues to monitor the battery operations. Otherwise, if a new battery cycle has started, the process proceeds to operation 216 and the system controller 150 resets the category level to default.

Figure 3:
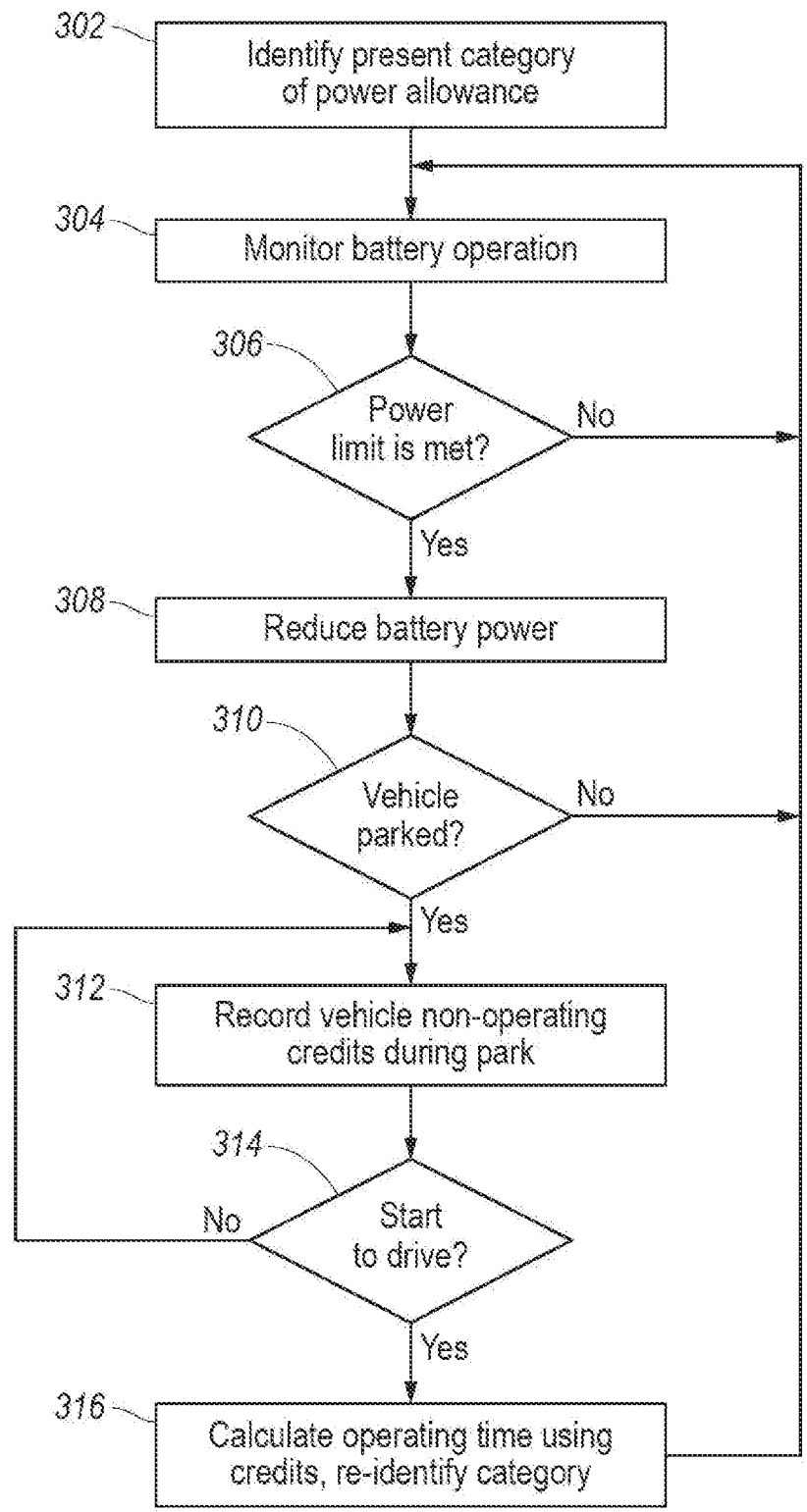
FIG. 3 illustrates a flow diagram for another battery control process.

Referring to FIG. 3, an example flow diagram for a battery control process 300 is illustrated. In addition to the process 200 illustrated with reference to FIG. 2, the process 300 records non-operating credits when the vehicle is parked. Operations 302 to 308 of the process 300 are similar to operations 202 to 208 of the process 200 described with reference to FIG. 2 and therefore will not be repeated herein. Responsive to detecting the vehicle 112 has parked at operation 310, the process proceeds to operation 312 and the system controller 150 starts to record and generate the non-operating credits during the time period when the vehicle is parked. When a vehicle is parked, little current may be drawn from the traction battery 124 which provides a good condition for the battery cells to cool down and recover. The non-operating time may be used to compensate any battery operating time before the vehicle is parked. In other words, the computing system 150 may be configured to "count back" the operating time previously recorded at operation 304. Responsive to detecting the vehicle starts to drive again at operation 314, the process proceeds to operation 316 and the computing platform 150 adjusts the operating time using the non-operating credits generated during the parking and re-identifies the category of power allowance using the operating time as adjusted. The non-operating credits may be generated using one or more of the allowance categories. In the present example, the non-operating credits may be generated using the No. 1 category of allowance corresponding to 70 A current. For instance, if the vehicle is parked for 2 hours after a 5 hours drive at an average current of 50 A, a 140 Ah credit may be applied to a 250 Ah charge—making the new operating charge 110 Ah. Based on the newly determined operating charge, the computing platform 150 may "dial back" the power allowance from category No. 3 to category No. 1.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. The terms controller and controllers, for example, can be used interchangeably.

As previously described, the features of various embodiments can be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to strength, durability, life cycle, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
a battery;
a sensor configured to measure an output current of the battery; and
a controller programmed to
adjust a first current threshold and a first period of time using data indicative of battery health such that responsive to higher battery health, a higher first current threshold and a shorter first period of time is used, and responsive to lower battery health, a lower first current threshold and a longer first period of time is used,
during a predefined period of time and responsive to an average current of the battery exceeding the first current threshold for the first period of time, reduce a maximum current threshold of the battery by a first amount, and,
during the predefined period of time and responsive to the average current exceeding a second current threshold for a second period of time, further reduce the maximum current threshold by a second amount, wherein the second current threshold is less than the first current threshold, and the second period of time is longer than the first period of time.

2. The vehicle of claim 1, wherein the controller is further programmed to, responsive to expiration of the predefined period of time, reset the maximum current threshold of the battery.

3. The vehicle of claim 1, further comprising:
an engine; and
a fuel storage configured to maintain a fuel level to supply fuel to the engine, wherein the controller is further programmed to determine the first current threshold and first period of time using the fuel level such that responsive to a higher fuel level, a higher first current threshold and a shorter first period of time is used, and responsive to a lower fuel level, a lower first current threshold and a longer first period of time is used.

4. The vehicle of claim 1, wherein the first amount is greater than the second amount.

5. The vehicle of claim 1, wherein the first current threshold and first period of time period are associated with a lesser amount of battery energy compared with the second current threshold and second period of time.

6. The vehicle of claim 1, wherein the controller is further programmed to, responsive to detecting a parking event, generate a non-operating credit based on a duration of the parking event, and responsive to detecting the vehicle staring to drive, apply the non-operating credit to a battery operating condition.

7. A method comprising:
reducing a maximum current threshold of a traction battery by a first amount after an average current of the traction battery exceeds a first current threshold for a first time period during a battery cycle; and
reducing the maximum current threshold by a second amount after the average current exceeds a second current threshold less than the first current threshold for a second time period longer than the first time period during the battery cycle to affect battery health.

8. The method of claim 7 further comprising, responsive to the battery cycle ending, resetting the maximum current threshold of the traction battery.

9. The method of claim 7 further comprising determining the first current threshold and first time period using data indicative of battery health such that responsive to higher battery health, a higher first current threshold and shorter first time period is used, and responsive to lower battery health, a lower first current threshold and longer first time period is used.

10. The method of claim 7, further comprising determining the first current threshold and first time period using a fuel level such that responsive to a higher fuel level, a higher first current threshold and shorter first time period is used, and responsive to a lower fuel level, a lower first current threshold and longer first time period is used.

11. The method of claim 7, wherein the first amount is greater than the second amount.

12. The method of claim 7, wherein the first current threshold and first time period are associated with a lesser amount of battery energy compared with the second current threshold and second time period.

13. The method of claim 7 further comprising, responsive to detecting a parking event, generating a non-operating credit based on a duration of the parking event, and responsive to detecting a vehicle staring to drive, applying the non-operating credit to a battery operating condition.

14. A power system for a vehicle comprising:
a controller programmed to,
after an average current of a traction battery exceeds a first threshold value for a first duration of a predefined period of time, reduce a maximum current threshold of the battery by a predefined amount for an entirety of a rest of the predefined period of time, and
upon expiration of the predefined period of time, increase the maximum current threshold.

15. The power system of claim 14, wherein the controller is further programmed to, after the average current exceeds a second threshold value for a second duration of the predefined period of time, further reduce the maximum current threshold by a second predefined amount for the entirety of the rest of the predefined period of time.

16. The power system of claim 14, wherein the first predefined amount is greater than the second predefined amount.

17. The power system of claim 14, wherein the first threshold and first duration of time period are associated with a lesser amount of battery energy compared with the second threshold and second duration of time.

* * * * *